United States Patent [19]
Kawai et al.

[11] Patent Number: 5,849,460
[45] Date of Patent: Dec. 15, 1998

[54] PHOTOSENSITIVE RESIN COMPOSITION AND METHOD FOR USING THE SAME IN MANUFACTURE OF CIRCUIT BOARDS

[75] Inventors: Yoshinori Kawai, Yokohama; Mineo Kawamoto, Hitachi; Junichi Katagiri, Naka-machi; Masanori Nemoto, Juo-machi; Akio Takahashi, Hitachitota, all of Japan

[73] Assignee: Hitachi, Ltd., Tokyo, Japan

[21] Appl. No.: 895,576

[22] Filed: Jul. 16, 1997

Related U.S. Application Data

[63] Continuation of Ser. No. 508,190, Jul. 27, 1995, abandoned.

[30] Foreign Application Priority Data

Jul. 27, 1994 [JP] Japan .................................. 6-175110

[51] Int. Cl.$^6$ ...................................................... G03F 7/028
[52] U.S. Cl. ...................... 430/280.1; 522/102; 522/109; 522/101; 522/111; 522/146
[58] Field of Search ......................... 430/280.1; 522/102, 522/101, 109, 111, 146

[56] References Cited

U.S. PATENT DOCUMENTS

| | | | |
|---|---|---|---|
| 4,469,777 | 9/1984 | O'Neil | 430/315 |
| 4,554,229 | 11/1985 | Small, Jr. | 430/280.1 |
| 4,628,022 | 12/1986 | Ors et al. | 430/280.1 |
| 5,100,767 | 3/1992 | Yanagawa et al. | 430/280.1 |
| 5,178,988 | 1/1993 | Leech et al. | 430/280.1 |

FOREIGN PATENT DOCUMENTS

| | | |
|---|---|---|
| 478313 | 4/1992 | European Pat. Off. . |
| 1054390 | 11/1989 | Japan . |
| 3-253092A | 11/1991 | Japan .................................. 430/280.1 |
| 4148-590 | 5/1992 | Japan . |
| 5-19470A | 1/1993 | Japan .................................. 430/280.1 |
| 5033840 | 5/1993 | Japan . |

OTHER PUBLICATIONS

PTO 96–3803, English Translation of Japanese Kokoku Patent No. Hei [1989]–54390, "Resist Ink Compositon", Kamagatsu et al., translated Jun., 1996, 40 pages.

Roger Grant et al, *Grant & Hackh's Chemnical Dictionary* 5th Ed, McGraw Hill Book Company, New York, NY, 1987, p.216, "Epoxy*".

Sybil P. Parker, ed, *McGraw–Hill Dictionary of Chemical Terms*, McGraw Hill Book Company, New York, NY, 1985, p. 155, "epoxy resin".

*Encyclopedia of Polymer Science and Engineering,* vol. 6, John Wiley & Sons, New York, N.Y, 1986, pp. 322–334.

*Primary Examiner*—Cynthia Hamilton
*Attorney, Agent, or Firm*—Evenson, McKeown, Edwards & Lenahan P.L.L.C.

[57] ABSTRACT

A photosensitive resin composition for use in manufacture of multi-layer circuit boards with connecting holes between layers is disclosed. The resin composition has excellent adhesion with a plating metal, resolution, photo-curing, thermosetting, thermal resistance, and is capable of being developed using an alkaline solution or an aqueous solution containing a non-halogen based organic solvent as the developing solution. The resin composition comprises a photosensitive epoxy resin, a thermosetting epoxy resin, a reactant of a carboxylic acid added to an acrylonitrile-butadiene rubber and an epoxy resin, a photopolymerization initiator and a thermosetting agent. This reactant facilitates a high density pattern of connecting holes for circuit boards of the layered type.

6 Claims, 2 Drawing Sheets

PHOTOSENSITIVE RESIN COMPOSITION AND METHOD FOR USING THE SAME IN MANUFACTURE OF CIRCUIT BOARDS

This application is a continuation of application Ser. No. 08/508,190, filed on Jul. 27, 1995, now abandoned.

BACKGROUND AND SUMMARY OF THE INVENTION

The present invention relates to a photosensitive resin composition and method of using same in the manufacture of circuit boards and the like. The photosensitive resin composition of the present invention has excellent adhesion, resolution, photo-curing, thermosetting, and thermal resistance, and more particularly to a photosensitive resin composition which can be used as a layer-to-layer insulation material for forming photo-connecting-holes in a print board of the layered type.

In recent years, there has been an increasing need for a high density multi-layer print board used for various electronic apparatuses as electronic technology has progressed. As for the method of making the multi-layer print board, a layered method is being developed. In this method, conductive circuits and organic insulation layers are alternatingly laminated, and the circuit wires are connected to one other via connecting-holes.

If a solder-resist of a common photosensitive resin composition is used as a layer-to-layer insulation material for forming photo-connecting-holes in a print board of the layered type, a problem arises in that swelling occurs in the plated films because of poor adhesion between the resin and metals. Furthermore, the solder has poor thermal resistance.

This results in limitations on the density of holes and the resolution of wires that can be incorporated in the manufacture of circuit boards. Due to the ever increasing complexity of circuits and miniaturization, the resin resolution is important.

In order to solve this problem, a method is proposed in which a resin or a filler for increasing adhesion with a metal is added to a photosensitive resin composition. A resin composition is disclosed in European Patent Application No. 0 478 313, counterpart of Published Japanese Patent Application No. 4-148590 (1992), where resin containing a kind of photosensitive epoxy resin is used as a photosensitive resin. This resin has a resolution limit of 120 μm and an adhesion of less than 1 kgf/cm. Further, there is a drawback in that development requires the use of a flammable mixture of propylene carbonate, cyclohexanone and gamma-butyrolactone.

Further, a method is disclosed in Published Japanese Patent Application No. 5-33840 (1993), where a resin composition is added to a thermal fine powder resist resin which has a higher solubility in the oxidizing agent than in the cured material of the resin, and a thermal fine powder resist resin which has a lower solubility in the oxidizing agent than in the cured material of the resin. However, in this method, roughening of the resin requires the use of chromic acid which causes safety and workability problems. Further, there is a problem in that development requires the use of chlorocene which is a specific freon.

The resists disclosed in the patent publications referred to above and now on the market have a problem with safety and workability since they require the use of flammable organic solvents or chlorocene of a special freon, which will be prohibited in the near future in order to preserve the ozone layer. In addition to this, their adhesion with metals is not sufficient, and there is a problem in that chromic acid, which has safety and workability problems, has to be used in the roughening process.

On the other hand, there is a photosensitive resin composition using an alkaline solution instead of an organic solvent as the developing solution, which is disclosed in Examined Japanese Patent Application No. 1-54390 (1989). This photosensitive resin composition can be developed using an alkaline solution by introducing carboxylic acid into an epoxy resin. However, since no component to increase the adhesion with metals is added to the resin, its adhesion is low and, therefore, the photosensitive resin composition cannot be used as a layer-to-layer insulation material for forming photo-connecting-holes in a print board of the layered type.

An object of the present invention is to provide an improved photosensitive resin composition which can be used as a layer-to-layer insulation material for forming photo-connecting-holes in a print board of the layered type or the like. According to certain aspects of preferred embodiments of the invention a photosensitive resin composition is provided having excellent characteristics of adhesion, resolution, photo-curing, thermosetting, and thermal resistance, while being capable of being developed using an alkaline solution or an aqueous solution containing a non-halogen based organic solvent. These preferred embodiments utilize a novel combination, including a reactant of a carboxyl modified acrylonitrile-butadiene rubber and an epoxy resin used in the present invention greatly hole density and thus wiring possibilities for printed circuit boards. This particular group of reactants greatly increase the hole density that can be achieved while facilitating a development process that avoids negative effects on the environment.

Other objects, advantages and novel features of the present invention will become apparent from the following detailed description of the invention when considered in conjunction with the accompanying drawings.

DETAILED DESCRIPTION OF THE INVENTION

Figure 1:
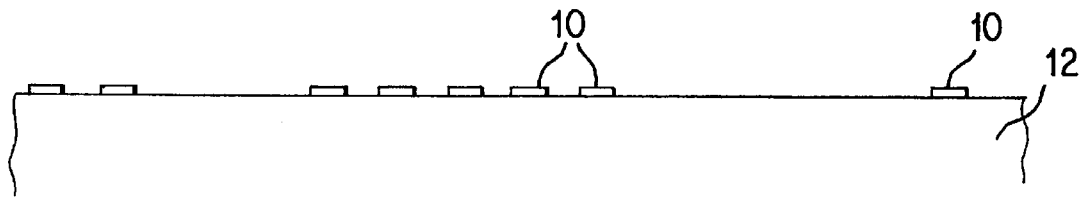
FIG. 1 is a schematic view showing a substrate with connecting wires before application of the photosensitive resin composition of the present invention.

There is a need to improve photosensitive resin characteristics because of limited hole density and thus wiring possibilities for printed circuit boards. A reactant of a carboxyl modified acrylonitrile-butadiene rubber and an epoxy resin (component (c) in the following description) used in the present invention greatly hole density and thus wiring possibilities for printed circuit boards.

A photosensitive resin composition according to the present invention comprises (a) a photosensitive epoxy resin, (b) a thermosetting epoxy resin, (c) a reactant of a carboxyl modified acrylonitrile-butadiene rubber and an epoxy resin, (d) a photo-polymerization initiator, and (e) a thermosetting agent.

The component in item (a) of the photosensitive epoxy resin used in the present invention is obtained by reacting an unsaturated carboxylic acid with the following epoxy resins to add a photosensitive group such as acrylic acid or methacrylic acid. The epoxy resin is an epoxy resin phenol novolak type, or an epoxy resin cresol novolak type, for example: products of Toto Chemicals Co.: YDCN-701, YDCN-704, YDCN-638, YDCN-602; products of Dow Chemicals Co.: DEN-431, DEN-439; products of Ciba Geigy Co.: EPN-1138, EPN-1235, EPN-1299; products of Dai-nippon Ink and Chemicals, Inc.: N-730, N-770, N-865, N-665, N-673, N-695, VH-4150, VH-4240, VH-4440; products of Nihon Kayaku Co.: EOCN-120, EOCN-104, BRPN-1020 BREN-S; products of Asahi Chemical Industry Co.: ECN-265, ECN-293, ECN-285, ECN-299; a product of Sumitomo Chemicals Co.: ESCN-195, or an epoxy resin halide of phenol novolak type, an epoxy resin bisphenol A type, an epoxy resin bisphenol F type, an epoxy resin hydro-bisphenol A type, or an epoxy resin glycidyl-ether type, for example; products of Chemical Industry of Shell Co.: Epicoat 828, Epicoat 834, Epicoat 1001, Epicoat 1004, Epicoat 1010; products of Asahi Electro-Chemicals Co.: EP-4100, EP-5100; products of Dai-nippon Ink and Chemicals, Inc.: Epiclon 840, Epiclon 860, Epiclon 3050, Epiclon 830; products of Dow Chemicals Co.: DER-330, DER-337, DER-361; a product of Sumitomo Chemicals Co.: ESB-400 or an exoxy resin halide of bisphenol A type.

The component in item (a) of another photosensitive epoxy resin is obtained by reacting a saturated or unsaturated polybasic acid anhydride with the above epoxy resin hydroxyl to add carboxylic acid thereto. The acid anhydride used is maleic acid anhydride, succinic acid anhydride, itaconic acid anhydride, phthalic acid anhydride, tetrahydrophthalic acid anhydride, hexahydrophthalic acid anhydride, methyl-hexahydrophthalic acid anhydride, endomethylene-tetrahydrophthalic acid anhydride, methyl-endomethylene-tetrahydrophthalic acid anhydride, chlorendic acid anhydride, methyl-tetrahydrophthalic acid anhydride, trimellitic acid anhydride, pyromellitic acid anhydride or benzophenone-tetracarboxylic acid anhydride.

The component in item (b) of a thermosetting epoxy resin is an epoxy resin phenol novolak type, or; and an epoxy resin cresol novolak type, for example: products of Toto Chemicals Co.: YDCN-701, YDCN-704, YDCN-638, YDCN-602; products of Dow Chemicals Co.: DEN-431, DEN-439; products of Ciba Geigy Co.: EPN-1138, EPN-1235, EPN-1299; products of Dai-nippon Ink and Chemicals, Inc.: N-730, N-770, N-865, N-665, N-673, N-695, VH-4150, VH-4240, VH-4440; products of Nihon Kayaku Co.: EOCN-120, EOCN-104, BRPN-1020, BREN-S; products of Asahi Chemical Industry Co.: ECN265, ECN-293, ECN-285, ECN-299; a product of Sumitomo Chemicals Co.: ESCN-195, or epoxy resin halide of phenol novlak type, an epoxy resin bisphenol A type, an epoxy resin bisphenol F type, an epoxy resin hydro-bisphenol A type, or an epoxy resin glycydyl-ether type, for example: products of Chemical Industry of Shell Co.: Epicoat 828, Epicoat 834, Epicoat 1001, Epicoat 1004, Epicoat 1010; products of Asahi Electro-Chemicals Co.: EP-4100, EP-5100; products of Dai-nippon Ink and Chemicals, Inc.: Epiclon 840, Epiclon 860, Epiclon 3050, Epiclon 830; products of Dow Chemicals Co.: DER-330, DER-337, DER-361; a product of Sumitomo Chemicals Co.: ESB400or an epoxy resin halide of bisphenol A type.

The composition in item (c) of a reactant of a carboxyl modified acrylonitrile-butadiene rubber and an epoxy resin is obtained by a reaction of acrylonitrile-butadiene rubber modified by adding a compound containing a carboxyl group with the epoxy resin at a high temperature.

For the acrylonitrile-butadiene rubber modified by adding a compound containing a carboxyl group, the Hycar series of products of Ube Industries Ltd. (CTBN 1300×31, CTBN 1300×8, CTBN 1300×l3, CTBN 1300×9), Nippol-1072 made by Nihon Zeon Co., and PNR-1H made by Nihon Synthetic Rubber Co. are available.

For the epoxy resin for the reaction with the above carboxyl modified acrylonitrile-butadiene rubber, bisphenol A type explained in relation with the (b) component above, bisphenol F type, hydrogenated bisphenol A type, phenol novolak type and cresol novolak type are available.

For the reaction of a carboxyl modified acrylonitrile-butadiene rubber and an epoxy resin, DT-8208 made by Daito Industries Co., and TSR-960 made by Dai-nippon Ink and Chemicals Co. are available.

As the component in item (d) of a photo-polymerization initiator, the following can be used alone or in a combination of two or more: benzoin, benzyl, benzoin-methyl ether, benzoin-isopropyl ether, acetophenone, 2,2-dimetoxy-1,2-dichloro-acetophenone, 1-hydroxycyclohexylphenyl ketone, 2-methyl-1-(4-(methylthio)phenyl)-2-morpholinopropane-1-one, 2-benzyl-2-dimethylamino-1-(4-morpholinophenyl) butanone, N,N-dimethylaminoacetophenone, 2-methylanthraquinone, 2-ethylanthraquinone, 2-t butylanthraquinone, 1-chloroanthraquinone, 2-aminoanthraquinone, 2,4-dimethylthioxanthone, 2,4-diethylthioxanthone, 2,4-diispropylthioxanthone, acetophenonedimethylketal, methylbenzophenone, 4,4'-dichlorobenzophenone, 4,4'-bisdiethylaminobenzophenone, 2-hydroxy-2-methyl-1-phenylpropanone, 1-(4-(2-hydroxyethoxy)-phenyl)-2-hydroxy-2-methylpropanone, bis(cychlopentadienyl)-bis(2,6-difluoro-3-(pyr-1-ir) titanium, Michiler,s ketone. Further, the above photo-polymerization initiator can be used in combination with the photo-sensitizer alone or in a combination of two or more kinds of N,N-dimethyl-amino-benzoic-acid-ethyl ester, N,N-dimethyl-amino-benzoic-acid-isoamyl ester, N,N-dimethyl-amino-benzophenone, triethanolamine, or triethylamine.

As the component in item (e) of a thermosetting agent, the following can be used alone or in a combination of two or more: amino-curing agents such as diamino-diphenyl-sulfone, diamino-diphenyl-methane, piperidine, tetramethyl-guanidine and the like; acid anhydrides such as trimellitic acid anhydride, tetrahydrophthalic acid anhydride, hexahydrophthalic acid anhydride, polyazeline acid anhydride and the like; imidazoles such as 2-heptadecyl-imidazole, 1-cyanoethyl-2-ethyl-4-methylimidazole, 2,4-diamino-6-(2-undecylimidazole-(1))-ethyl-S-triazine, 1-dodecyl-2-methyl-3-benzilimidazolium-chloride and the like; boron trifluoride amine complex; dicyan-diamide and its derivatives; hydrazide organic acid; melamine; aromatic diazonium salt; diallyl-iodonium salt; triallylsulphonium salt; phenol resin; amino resin; polyvinylphenol and so on.

The amount of component (a) used is preferably 10 to 80% of the total weight of the resin composition, and most preferably 10 to 50%. When the amount of component (a) is less than 10%, its solubility in the aqueous alkaline developing solution decreases. When the amount of component (a) is more than 50%, the resistance against the developing solution and the roughening property of the cured film decrease. The amount of component (b) used is preferably 10 to 80% of the total weight of the resin, and most preferably 10 to 50%. When the amount of component (b) is less than 10%, the adhesion to the metal of the inner wiring layer decreases. When the amount of component (b) is more than 50%, the developing property deceases. The amount of component (c) used is preferably 10 to 80% of the total weight of the resin, and most preferably 10 to 50%. When the amount of component (c) is less than 10%, the adhesion to the plated metal decreases. When the amount of component (c) is more than 50%, the film forming property and the thermal resistance decrease. The amount of component (d) used is preferably 0.1 to 10% of the total weight of the resin. When the amount of component (d) is less than 0.1%, the photo-curing property and the developing property decrease. When the amount of component (d) is more than 10%, the curing property inside the resin decreases and the adhesion to the metal of the inner layer wiring decreases. The amount of component (e) used is preferably 0.1 to 20% of the total weight of the resin. When the amount of component (e) is less than 0.1%, the curing property of the thermosetting epoxy resin decreases. When the amount of component (e) is more than 20%, the plating deposition property and the electrical property decrease.

For the resin compositions according to the present invention obtained as described above, it is additionally possible to use a well-known photo-polymerizing monomer such as 2-hydroxyethylacrylate, 2-hydroxypropylacrylate, N-vinylpyroridone or the like as a diluent, if necessary. Further, it may be possible to add a well-known filler such as barium sulfate, silicon dioxide, talc, clay, calcium carbonate and so on; a well-known pigment such as phthalocyanine blue, phthalocyanine green, titanium dioxide, carbon black and so on; various additives such as a defoaming agent, leveling agent and so on; and a well-known polymerization prohibiter such as hydroquinone, hydroquinone-monomethyl ether, pyrogallol, t-butylcatechol, phenothiazine and so on.

The acid value of the resin composition according to the present invention is preferably smaller than 50 mgKOH/g. When the acid value is larger than 50 mgKOH/g, the quality of film is apt to be altered during development after photo-curing.

The aforementioned resin composition can be used as a liquid by dissolving it in an organic solvent. The organic solvents used are ketones such as methyl ketone, cyclohexanone and the like; aromatic hydrocarbons such as toluene, xylene and the like; cellosolves such as cellosolve, butyl-cellosolve and the like; carbitols such as carbitol, butylcarbitol and the like; and acetate esters such as ethyl acetate, butyl acetate, cellosolve acetate, butylcellosolve acetate, carbitol acetate, butylcarbitol acetate and the like.

Figure 2:
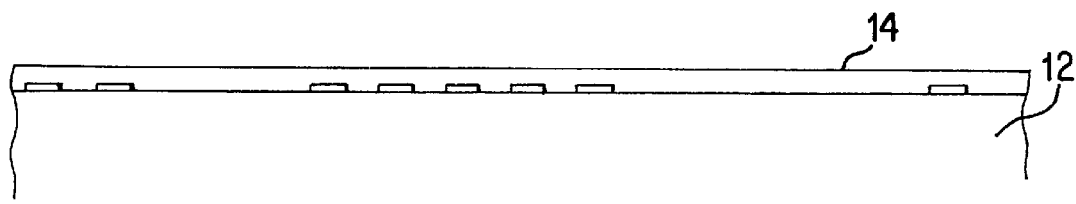
FIG. 2 is a schematic view of the FIG. 1 assembly depicting application of the photosensitive resin composition.
Figure 3:
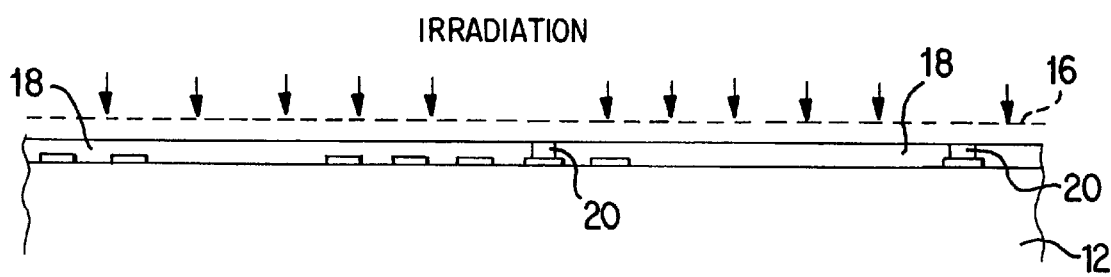
FIG. 3 is a schematic view depicting irradiation through a mask of FIG. 2 assembly.
Figure 4:
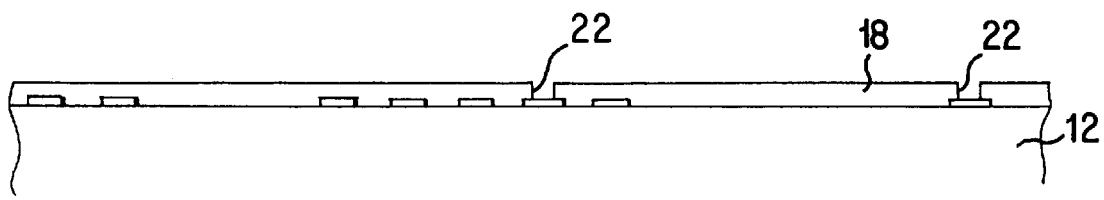
FIG. 4 is a schematic view of the assembly of FIG. 3 showing the condition after selective curing of the photosensitive resin.
Figure 5:
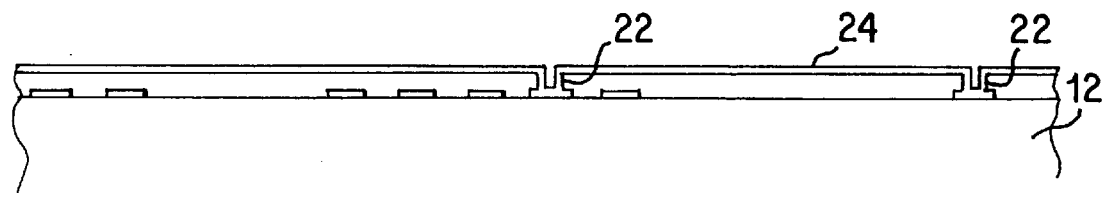
FIG. 5 is a schematic view of the assembly of FIG. 4 showing plating applied to the circuitry on board.

Connecting-holes are formed by applying the photosensitive resin composition (14) on the inner wiring (10) of a print board (12). (See FIGS. 1 and 2.) Then irradiating with activating energy beams on the necessary portion of the inner wiring print board through a mask (16) to photo-cure the resin at selected locations (18), and by dissolving the unexposed portion (20) using the developing solution. (See FIGS. 3 and 4.) Further, after the exposing process, if necessary, the resin is cured by heating. The surface of the layer-to-layer insulation layer having connecting-holes (22) produced in the manner described above is roughened using aqueous permanganate solution, added to a catalyst for plating again, then being plated with plating material (24) to form a circuit thereon. (See FIG. 5.) By repeating the above steps it is possible to manufacture a printed circuit board with multiple layers using the disclosed photosensitive resin composition.

Since the photosensitive resin composition according to the present invention hardly has any remaining carboxylic acid after curing, the result is that the electro-corrosion resistance is improved.

As for the method of applying the photosensitive resin composition to an inner layer wiring print board, there are well-known methods such as screen printing, roll coating and curtain coating. After applying, the resin is dried by heating. The drying temperature is 30° C. to 100° C., preferably 50° C. to 80° C. When the temperature is too low, the drying does not progress. On the other hand, when the temperature is too high, the thermosetting epoxy resin is cured and cannot be developed. The drying period is 15 minutes to 2 hours, preferably 20 minutes to 40 minutes. When the period is too short, the drying does not progress. When the period is too long, the resin is cured before exposure.

As for the irradiating source of the activating energy beams necessary to cure the photosensitive resin composition described above, the following are suitable: a low-pressure mercury lamp, a middle-pressure mercury lamp, a high-pressure mercury lamp, an ultra-high-pressure mercury lamp, a xenon lamp and a metal halide lamp. The amount of exposure is 100 to 2,000 mJ/cm$^2$, preferably 200 to 1,000 mJ/cm$^2$. When the exposure is too small, the resin does not cure. When the exposure is too large, the resolution decreases. Laser beams may be used as the irradiating source of the activating energy beams.

As for developing the resin according to the present invention, it is possible to utilize well-known methods such as spray developing where the developing solution is sprayed on to a board, and dip developing where a board is dipped and vibrated in the developing solution. The temperature of the developing solution is 10° C. to 50° C., preferably 30° C. to 40° C. When the temperature is too low, developing cannot be performed. And when the temperature is too high, the cured portion dissolves. As for the developing solution, the following can be used: aqueous alkaline solutions such as aqueous sodium carbonate and the like; aqueous alkaline solutions prepared by dissolving in diethyleneglycol-monobutyl-ether non-organic alkaline agents such as sodium silicate, potassium silicate, sodium hydroxide, potassium hydroxide, lithium hydroxide, sodium tertiary phosphate, ammonium tertiary phosphate, sodium secondary phosphate, ammonium secondary phosphate, sodium borate, ammonium borate, ammonia and so on; aqueous alkaline solutions prepared by dissolving in diethyleneglycol-monobutyl-ether alkaline organic amine compounds such as monomethylamine, dimethylamine, trimethylamine, monoethylamine, diethylamine, triethylamine, monoisopropylamine, di-isopropylamine, tri-isopropylamine, n-butylamine, monoethanolamine, diethanolamine, triethanolamine, monoisopropanolamine, di-isopropanolamine, ethylenimine, ethylendiamine, pylidine and so on. These alkaline agents may be used solely or in a combination of two or more. The content of the alkaline agent is preferably 0.1 to 5.0% of the total weight of the developing solution used. When the content is less than 0.1%, removal of the non-cured photosensitive layer becomes incomplete. When the content is more than 5%, the mechanical and the chemical strength of the photosensitive layer degrades. The content of diethyleneglycol-monobutylether is preferably 10 to 90% of the total weight of the developing solution used. When the content is less than this range, removal of non-cured photosensitive layer becomes incomplete. When the content is more than this range, the mechanical and the chemical strength of the photosensitive layer degrades.

If necessary, after developing, the resin composition according to the present invention is post-exposed to be cured. This post-exposure increases the depth of the curing and has an effect of keeping the shape of the connecting-holes. As for the irradiating source, the following are suitable: a low-pressure mercury lamp, a middle-pressure mercury lamp, a high-pressure mercury lamp, an ultra-high-pressure mercury lamp, a xenon lamp and a metal halide lamp. The amount of exposure is preferably 500 to 2,000 mJ/cm$^2$. Then the resin is cured by heating. The heating temperature is preferably 100° C. to 200° C. When the temperature is too low, the adhesion between the resin and the inner layer metal decreases. When the temperature is too high, the resin surface is hardly roughen and consequently adhesion with the plated metal decreases. The curing period is preferably 15 minutes to 1 hour. When the time is shorter, the curing becomes incomplete and decreases the adhesion with the inner layer metal and the thermal resistance. When the time is longer, the resin surface becomes difficult to roughened and consequently the adhesion with the plated metal decreases.

In order to improve the adhesion between the resin layer and the plating metal in a print board, it is commonly known that the surface of the photosensitive resin layer is roughened using an oxidizing agent such as chromic acid. Similarly, in the present invention, the surface of the photosensitive resin layer is roughened using an oxidizing agent in order to improve the adhesion between the resin layer and the plating metal. The method of roughening is that a board having a photosensitive resin layer is dipped into an oxidizing agent solution or an oxidizing agent solution is sprayed on the surface of a photosensitive resin layer. In the present invention, the preferred oxidizing agent is permanganate, taking the environmental aspect into consideration. In order to effectively perform the roughening, it is useful to slightly grind the surface of the photosensitive resin in advance with grinding means such as a polishing apparatus or a liquid honing apparatus using a fine powder grinding agent or the like.

After completion of the above processes, a well-known catalyst for non-electric plating reaction is attached on the insulation layer to perform an activation treatment. Then, wiring is formed by full-additive, semi-additive or subtractive methods through non-electric plating or a combination of non-electric plating and electric plating.

As has been described above, the photosensitive resin composition according to the present invention has excellent properties, that is, the adhesion with plating metal is more than 2 kgf/cm$^2$, the resolution is 70 μm, the soldering thermal resistance is above 60 seconds at 260° C., with the thermal deformation temperature being above 100° C.

It is commonly known that acrylonitrile-butadiene rubber is added into a resin composition in order to improve the adhesion between the resin layer and the plating metal of a print board. In this method, however, the thermal resistance is lower, and the resolution and the sensitivity are lower since the miscibility with the photosensitive resin composition is poor. In the present invention, a reactant obtained by a reaction of an acrylonitrile-butadiene rubber having a carboxyl group at its terminal positions with epoxy resin is added into a resin composition instead of the rubber component. Thereby, the resin layer can be roughened using permanganate without deteriorating the thermal resistance and can improve adhesion between the resin and the plating metal. The miscibility with the photosensitive resin is excellent, and the resolution and sensitivity are improved.

Since conventional photosensitive resin compositions have poor adhesion with metals, swelling and separation take place in the interface between the inner circuit layer and the resin or in the interface between the plating metal and the resin. On the other hand, in the present invention since the reactant obtaining a reaction of an acrylonitrile-butadiene rubber having a carboxyl group at its terminal positions with epoxy resin is used instead of a rubber composition, the adhesion with the inner circuit layer and the plating metal is excellent, and swelling and separation do not take place.

It is known that when a rubber component is added to a resin, the thermal deformation temperature usually decreases. However, in the present invention, since the reactant obtained by a reaction of an acrylonitrile-butadiene rubber having a carboxyl group at its terminal positions with epoxy resin is used, a curing material having a high thermal deformation temperature can be obtained.

Since the major component of the resin composition according to the present invention is the epoxy resin, a cured film having an excellent thermal resistance can be obtained at a lower temperature and in a shorter time compared to the conventional photosensitive resins.

The present invention will be described in detail below, referring to embodiments and examples for comparison. Unless specified otherwise, the term "part" as used hereinafter refers to a weight based value.

Table 1 shows embodiments 1 to 6 and examples for comparison 1 to 6 of the photosensitive resin compositions according to the present invention.

| COMPONENT | TRADE NAME | MANUFACTURER | EMBODIMENT | | | | | |
|---|---|---|---|---|---|---|---|---|
| | | | 1 | 2 | 3 | 4 | 5 | 6 |
| COMPONENT A | | | | | | | | |
| COMPONENT a | RESIN (a-1) | | 35 | | | | | |
| | RESIN (a-2) | | | 35 | | | | |
| | RESIN (a-3) | | | | 35 | | | |
| | RESIN (a-4) | | | | | 35 | | |
| | RESIN (a-5) | | | | | | 35 | |
| | RESIN (a-6) | | | | | | | 35 |
| COMPONENT b | Ep1001 | SHELL PETRO-CHEMICAL | 5 | | | 5 | | |
| | ESCNI95 | SUMITOMO CHEMICALS | | 5 | | | 5 | |
| | EPPN201 | NIHON KAYAKU | | | 5 | | | 5 |
| COMPONENT c | DT-8208 | DAITO INDUSTRIES | 30 | | 30 | | 30 | |
| | TSR-960 | DAI-NIHON INK & CHEMICALS | | 30 | | 30 | | 30 |

-continued

| COMPONENT | TRADE NAME | MANUFACTURER | | | | | | |
|---|---|---|---|---|---|---|---|---|
| | M2000-20 | NIHON PETRO-CHEMICALS | | | | | | |
| | N640 | NIHON SYNTHETIC RUBBER | | | | | | |
| OTHERS | | | | | | | | |
| ACRYLIC MONOMER | DPCA-60 | NIHON KAYAKU | 3 | 3 | 3 | 3 | 3 | 3 |
| FILLER | E220A | NIHON SILICA | 3 | 3 | 3 | 3 | 3 | 3 |
| | KAOLIN CLAY | TUCHIYA KAOLIN | 2 | 2 | 2 | 2 | 2 | 2 |
| | TOYOLITE C | TOYO ELECTRO-CHEMICALS | 15 | 15 | 15 | 15 | 15 | 15 |
| DEFOAMING AGENT | SC5570 | TORAY SILICON | 2 | 2 | 2 | 2 | 2 | 2 |
| COMPONENT B | | | | | | | | |
| COMPONENT | I-651 | CIBA GEIGY | 2 | | | 2 | | |
| d | I-907 | CIBA GEIGY | | 2 | | | 2 | |
| | D-1173 | CIBA GEIGY | | | 2 | | | 2 |
| COMPONENT | $C_{11}Z$—AZIN | SHIKOKU CHEMICALS | 1.5 | | | 1.5 | | |
| e | $C_{11}Z$ | SHIKOKU CHEMICALS | | 1.5 | | | 1.5 | |
| | $C_{11}Z$—CN | SHOKOKU CHEMICALS | | | 1.5 | | | 1.5 |
| | H-2400 | HITACHI CHEMICALS | 1.5 | 1.5 | 1.5 | 1.5 | 1.5 | 1.5 |
| | ACID VALUE (mgKOH/g) | | 33.9 | 32.0 | 29.5 | 0.7 | 0.7 | 0.3 |

| | | | EXAMPLE FOR COMPARISON | | | | | |
|---|---|---|---|---|---|---|---|---|
| COMPONENT | TRADE NAME | MANUFACTURER | 1 | 2 | 3 | 4 | 5 | 6 |
| COMPONENT A | | | | | | | | |
| COMPONENT | RESIN (a-1) | | 35 | | | | | |
| a | RESIN (a-2) | | | 35 | | | | |
| | RESIN (a-3) | | | | 35 | | | |
| | RESIN (a-4) | | | | | 35 | | |
| | RESIN (a-5) | | | | | | 35 | |
| | RESIN (a-6) | | | | | | | 35 |
| COMPONENT | Ep1001 | SHELL PETRO-CHEMICAL | 5 | | | 5 | | |
| b | ESCN195 | SUMITOMO CHEMICALS | | 5 | | | 5 | |
| | EPPN201 | NIHON KAYAKU | | | 5 | | | 5 |
| COMPONENT | DT-8208 | DAITO INDUSTRIES | | | | | | |
| c | TSR-960 | DAI-NIHON INK & CHEMICALS | | | | | | |
| | M2000-20 | NIHON PETRO-CHEMICALS | 30 | | 30 | | 30 | |
| | N640 | NIHON SYNTHETIC RUBBER | | 30 | | 30 | | 30 |
| OTHERS | | | | | | | | |
| ACRYLIC MONOMER | DPCA-60 | NIHON KAYAKU | 3 | 3 | 3 | 3 | 3 | 3 |
| FILLER | E220A | NIHON SILICA | 3 | 3 | 3 | 3 | 3 | 3 |
| | KAOLIN CLAY | TUCHIYA KAOLIN | 2 | 2 | 2 | 2 | 2 | 2 |
| | TOYOLITE C | TOYO ELECTRO-CHEMICALS | 15 | 15 | 15 | 15 | 15 | 15 |
| DEFOAMING AGENT | SC5570 | TORAY SILICON | 2 | 2 | 2 | 2 | 2 | 2 |
| COMPONENT B | | | | | | | | |
| COMPONENT | I-651 | CIBA GEIGY | 2 | | | 2 | | |
| d | I-907 | CIBA GEIGY | | 2 | | | 2 | |
| | D-1173 | CIBA GEIGY | | | 2 | | | 2 |
| COMPONENT | $C_{11}Z$—AZIN | SHIKOKU CHEMICALS | 1.5 | | | 1.5 | | |
| e | $C_{11}Z$ | SHIKOKU CHEMICALS | | 1.5 | | | 1.5 | |
| | $C_{11}Z$—CN | SHOKOKU CHEMICALS | | | 1.5 | | | 1.5 |
| | H-2400 | HITACHI CHEMICALS | 1.5 | 1.5 | 1.5 | 1.5 | 1.5 | 1.5 |
| | ACID VALUE (mgKOH/g) | | 43.1 | 32.0 | 38.6 | 0.7 | 9.8 | 0.3 |

The difference between the embodiments according to the present invention and the examples for comparison is in the material for component (c).

The composition is prepared by kneading the component (A) in Table 1 using a kneader having three rolls and then adding component (B). Test pieces are formed by applying this composition to the entire surface of a glass epoxy substrate having a inner wiring layer of copper films having 18 μm thickness through screen printing and then drying them by heating at 80° C. for 30 minutes. The method of synthesis and the components used for the resins (a-1) to (a-6) in Table 1 are described below.

(1) Resin a-1

Epoxy resin cresol-novolak type, EPPN 210, a product of Nihon Kayaku Co., of 1 equivalent reacts with acrylic acid of 1.05 equivalent to form a reactant. The obtained reactant reacts with tetrahydrophthalic acid anhydride of 0.65 equivalent using propylene glycol-methylether-acetate as a solvent through known methods. This reactant is a liquid containing propylene glycol-methylether-acetate of 40 parts and shows an acid value of 72.7 mgKOH/g. Hereinafter, this is referred to as Resin (a-1).

(2) Resin a-2

Epoxy resin phenol-novolak type, YD-014, a product of Tokyo Chemicals Co., of 1 equivalent reacts with methacrylic acid of 1.05 equivalent to form a reactant. The obtained reactant reacts with phthalic acid anhydride of 0.65 equivalent using propylene glycol-methylether-acetate as a solvent through known methods. This reactant is a liquid containing propylene glycol-methylether-acetate of 40 parts and shows an acid value of 68.5 mgKOH/g. Hereinafter, this is referred to as Resin (a-2).

(3) Resin a-3

Epoxy resin phenol-novolak bromide type, BREN-S, a product of Nihon Kayaku Co., of 1 equivalent reacts with crotonic acid of 1.05 equivalent to form a reactant. The obtained reactant reacts with itaconic acid anhydride of 0.65 equivalent using propylene glycol-methylether-acetate as a solvent through known methods. This reactant is a liquid containing propylene glycol-methylether-acetate of 40 parts and shows an acid value of 63.2 mgKOH/g. Hereinafter, this is referred to as Resin (a-3).

(4) Resin a-4

Epoxy resin cresol-novolak type, EPPN 201, a product of Nihon Kayaku Co., of 1 equivalent reacts with acrylic acid of 1.05 equivalent using propylene glycol-methylether-acetate as a solvent through known methods. This reactant is a liquid containing propylene glycol-methylether-acetate of 40 parts and shows an acid value of 1.6 mgKOH/g. Hereinafter, this is referred to as Resin (a-4).

(5) Resin a-5

Epoxy resin phenol-novolak type, YD-014, a product of Tokyo Chemicals Co., of 1 equivalent reacts with methacrylic acid of 1.05 equivalent using propylene glycol-methylether-acetate as a solvent through known methods. This reactant is a liquid containing propylene glycol-methylether-acetate of 40 parts and shows an acid value of 1.5 mgKOH/g. Hereinafter, this is referred to as Resin (a-5).

(6) Resin a-6

Epoxy resin bisphenol A type, Epicote 828, a product of Shell Petrochemicals Co., of 1 equivalent reacts with crotonic acid of 1.05 equivalent using propylene glycol-methylether-acetate as a solvent through known methods. This reactant is a liquid containing propylene glycol-methylether-acetate of 40 parts and shows an acid value of 0.7 mgKOH/g. Hereinafter, this is referred to as Resin (a-6).

(7) Component b

Ep1001: Solid epoxy resin bisphenol A type, a product of Shell Petrochemical Co., having an epoxy equivalent of 450 to 500.

ESCN195: Solid epoxy resin cresol-novolak type, product of Sumitomo Chemicals Co., having an epoxy equivalent of 190 to 205.

EPPN201: Solid epoxy resin phenol-novolak type, product of Nihon Kayaku Co., having an epoxy equivalent of 180 to 200.

(8) Component c

DT-8208: A reactant obtained by a reaction of a acrylonitrile-butadiene rubber having a carboxyl group at its terminal positions (Hycar-CTNB) with bisphenol A type epoxy resin of a 1:1 ratio, the resin having an epoxy equivalent of 400 made by Daito Industries Co.

TSR-960: A reactant obtained by a reaction of acrylonitrile-butadiene rubber having a carboxyl group at its terminal positions (Hycar-CTBN) with bisphenol A type epoxy resin of a 1:1 ratio, the resin having an epoxy equivalent of 240 made by Daito Industries Co.

M2000-20: Polybutadiene-maleic acid reactant having an acid value of 20 mgKOH/g, adding a functional group with a ratio of 0.7 mol/mol, a product of Nihon Petrochemical Co.

N640: Acrylonitrile-butadiene rubber having an amount of acrylonitrile linkage of 25%, a product of Nihon Synthetic Rubber Co.

(9) Others

DPCA-60: 6-functional acryl monomer having a molecular weight of 1260, a product of Nihon Kayaku Co.

E220A: Silicon dioxide, a product of Nihon Silica Co.

Kaolin clay: Calcined kaolin clay, a product of Tsuchiya Kaolin Industries Co.

Toyolite C: Calcium carbonate, a product of Toyo Eleclrochemical Co.

SC5570: Defoaming agent, a product of Toray Silicon Co.

(10) Component d

I-651: Photo-curing agent, a product of Ciba Geigy Co., chemical name: 2,2-dimethoxy-1,2-diphenylethanone.

I-907: Photo-curing agent, a product of Ciba Geigy Co., chemical name: 2-methyl-1-(4methylthio)phenyl)-2-morpholinopropanone.

D-1173: Photo-curing agent, a product of Ciba Geigy Co., chemical name: 2-hydroxy-2-methyl-1phenylpropanone.

(11) Component e

C11Z-AZIN: Thermosetting agent having a melting point of 184° to 188° C., a product of Shikoku Chemicals Co.

C11Z: Thermosetting agent having a melting point of 70° to 74° C., a product of Shikoku Chemicals Co.

C11Z-CN: Thermosetting agent having a melting point of 45° to 50° C., a product of Shikoku Chemicals Co.

H2400: Alkyl-denaturalized phenol resin, a product of Hitachi Chemical Co.

Method and Evaluation

For each of the resin compositions obtained, a series of tests are performed on the developing property, resolution, thermal resistance, adhesion with the plating metal, and thermal deformation temperature according to the following methods.

(1) Developing Property

Spray developing for each of the test pieces is performed at 30° C. for 3 minutes using aqueous sodium carbonate solution of 1 wt % (hereinafter referred to as "alkaline developing solution"), and diethyleneglycol-monobutyl ether and aqueous sodium borate solution of 0.8 wt % (hereinafter referred to as "aqueous developing solution"). After developing, the test piece is washed with water for 5 minutes. After drying, the developing property of the test piece is evaluated through observation using an optical microscope. The criteria for the evaluation is as follows.

O: good developing property (the resin on the inner wiring layer is completely removed)

Δ: slightly poor developing property (a small amount of the resin remains on the inner wiring layer)

x: poor developing property (most of the resin remains on the inner wiring layer)

(2) Resolution

The test pieces are exposed to 300 mJ/cm$^2$ through a mask having printed holes of 10 to 250 μm in diameter, and developed using aqueous sodium carbonate solution of 1% having an acid value of approximately more than 30 mgKOH/g for embodiments 1 to 3 and examples for comparison 1 to 3, and using the aqueous developing solution for embodiments 4 to 6 and examples for comparison 4 to 6. After drying, the test pieces are observed using a scanning electron microscope and the smallest diameters of developed connecting-holes are recorded.

(3) Thermal Resistance and Adhesion with the Plating Metal

Thermal resistance and adhesion with the plating metal are evaluated by preparing test pieces as follows. After exposing the test pieces to 300 mJ/cm$^2$, the test pieces are post-exposed to 1 J/cm$^2$ using a high-pressure mercury lamp. Then the test pieces are heated at 150° C. for 1 hour. These test pieces are roughened at 50° C. for 5 minutes using a chemical roughening solution of aqueous potassium permanganate solution of 80 g/l adjusted to a pH of 13 using potassium hydroxide, and the test pieces are washed using 50° C. hot water for 5 minutes. Then, the roughened remainder is removed using aqueous sodium hydride solution of 6 g/l after washing with water, the test pieces are dipped for 2 minutes in a catalytic solution (HS101B, a product of Hitachi Chemical Co.) containing palladium which is a catalyst for nonelectrical plating (chemical plating). After washing with water, the catalyst is activated using aqueous hydrochloric acid solution of 100 ml/l. These boards are dipped in a non-electric copper plating solution containing copper sulfate of 10 g/l, ethylenediamine-4-acetic acid of 30 g/l, 37% HCHO aqueous solution of 3 ml/l, α,α'-dipyridyl 30 mg/l and adjusted to a PH of 12.5 using sodium hydride at 70° C. for 10 hours to form copper plating films having a thickness of approximately 30 μm. Then, the test pieces are washed with water and are post-cured at 160° C. for 30 minutes.

According to the testing method of JIS-C6481 adhesion with the plating metal is evaluated by peeling strength, and thermal resistance against soldering is measured by float at 260° C. using the obtained test pieces.

(4) Thermal Deformation Temperature

Glass transition temperature is evaluated by preparing test pieces as follows and using a thermo-physical testing machine (TMA-3000, a product of Shinkuu Rikou Co.). The preparation is prepared by kneading the component (A) in Table 1 using a kneader having three rolls and then adding component (B). Test pieces are formed by applying this composition to the entire surface of a polyethyleneterephthalate film through screen printing and drying them by heating at 80° C. for 30 minutes. After exposing the test pieces to 300 mJ/cm², the test pieces are post-exposed with 1 J/cm² using a high-pressure mercury lamp. Then the test pieces are heated at 150° C. for 1 hour, and further post-cured at 150° C. for 30 minutes. The test pieces are cut into pieces having 6 mm in width and 25 mm in length, and elongation is measured by applying a load of 1.3 g per film thickness of 1ym at a rising temperature rate of 5° C./minute. Glass transition temperature is defined as the intersecting point of two lines tangent to the elongation curve passing through points where the gradients of the elongation curve are largely different from each other.

The results of the embodiments and the examples for comparison are shown in Table 2.

the examples for comparison, good developing properties for the alkaline developing solution are obtained for the examples 1 and 3 for comparison using M2000-20 for component (c), among examples 1 to 3 for comparison which have an acid value of more than 30 mgkoh/g. Slightly poor aqueous developing properties are obtained for examples 1 and 3 for comparison. The others have poor developing properties.

As for resolution, all the embodiments obtain connecting-holes of 70 μm. On the other hand, in the examples for comparison, examples 1, 3, 5, using M2000-20 for component (c), obtain connecting-holes of 100 to 120 μm, and examples 2, 4, 6, using N640 for component (c), obtain connecting-holes of 200 μm. As for peeling strength, all the embodiments are above 2 kgf/cm. On the other hand, all the examples for comparison are below 0.2 kgf/cm.

As for soldering thermal resistance, all the embodiments have more than 60 seconds of thermal resistance. On the other hand, all the examples for comparison have less than 20 seconds of thermal resistance.

As for glass transition temperature, Tg's of 110° C. to 120° C. are obtained for the embodiments 1 to 5 using epoxy resin phenol novolak type or cresol novolak type for the photosensitive resin, and a Tg of 100° C. is obtained for embodiment 6 using epoxy resin bisphenol A type. On the other hand, in the examples for comparison, Tg's of 80° C. to 90° C. are obtained for examples 1, 3, 5, using M2000-20 for component (c), and Tg's of 70° C. to 80° C. are obtained for examples 2, 4, 6 using N640.

From the above results, the photosensitive resin composition according to the present invention has better developing properties, resolution, adhesion with the plating metal and thermal resistance compared to the conventional photosensitive resin composition.

Another two kinds of photosensitive compositions shown in Table 3 were prepared.

|  | EMBODIMENT | | | | | | EXAMPLE FOR COMPARISON | | | | | |
| --- | --- | --- | --- | --- | --- | --- | --- | --- | --- | --- | --- | --- |
|  | 1 | 2 | 3 | 4 | 5 | 6 | 1 | 2 | 3 | 4 | 5 | 6 |
| ALKALINE DEVELOPING PROPERTY | ○ | ○ | ○ | Δ | Δ | Δ | ○ | x | ○ | x | x | x |
| AQUEOUS SOLUTION DEVELOPING PROPERTY | ○ | ○ | ○ | ○ | ○ | ○ | Δ | x | ○ | x | x | x |
| RESOLUTION | 70 | 70 | 70 | 70 | 70 | 70 | 100 | 200 | 100 | 200 | 120 | 200 |
| PEELING STRENGTH (kgl/cm) | 2.2 | 2.1 | 2.2 | 2.0 | 2.1 | 2.1 | 0.1 | 0.2 | 0.1 | 0.1 | 0.1 | 0.1 |
| SOLDERING THERMAL RESISTANCE (SECONDS) | >60 | >60 | >60 | >60 | >60 | >60 | 15 | 30 | 20 | 15 | 15 | 10 |
| Tg (°C.) | 118 | 112 | 114 | 117 | 116 | 102 | 88 | 76 | 87 | 74 | 85 | 72 |

○: good developing property (the resin on the inner wiring layer is completely removed)
Δ: slightly poor developing property (a small amount of the resin remains on the inner wiring layer)
x: poor developing property (most of the resin remains on the inner wiring layer)

Good developing properties for the alkaline developing solution are obtained for embodiments 1 to 3 which contain photosensitive resins (a-1) to (a-3) with carboxylic acid and having an acid value of more than approximately 30 mgKOH/g. Slightly poor developing properties for the alkaline developing solution are obtained for embodiments 4 to 6 which contain photosensitive resins (a-4) to (a-6) without carboxylic acid and have an acid value of less than 1 mgkoh/g. However, good aqueous developing properties are obtained for all embodiments 1 to 6. On the other hand, in

TABLE 3

| Component | Name | Composition A | Composition B | Remarks |
| --- | --- | --- | --- | --- |
| a-Component | Resin a-1 | 50 |  | 1) |
|  | HR-30 |  | 50 |  |
| b-Component | BREN-105 | 5 | 10 | 2) |
|  | Ep-834 | 7 | 5 | 3) |
| c-Component | DT-8208 | 25 | 25 |  |

TABLE 3-continued

| Component | Name | Composition A | Composition B | Remarks |
|---|---|---|---|---|
| Acrylic monomer | DPCA-60 | 5 | 5 | |
| | EBR-100 | 8 | 5 | 4) |
| Filler | Crystalite5x | 5 | 5 | 5) |
| | N-600 | 34 | 34 | 6) |
| Antifoamer | SC5570 | 3 | 3 | |
| d-Component | I-651 | 4 | 4 | |
| | DETX-S | 1 | 1 | 7) |
| e-Component | $C_{11}$Z-AZIN | 5 | 5 | |
| | H-2400 | 2 | 2 | |
| Acid value (mg KOH/g) | | 36 | 1 | |

1) Tetrahydrophthalic acid anhydride in the resin a-1 was not added.
2) Brom phenol novolak type epoxy resin, made by Nihon Kayaku Co.
3) Bisphenol A type epoxy resin, made by Yuka shell Co.
4) Brom bisphenol A type methacrylate, made by Manac Co.
5) Silicon oxide of average diameter 0.5 μm, made by Tatsumori Industries Co.
6) Calcium carbonate of average diameter 0.9 μm. made by Nitto Funka Industries Co.
7) Sensitizer, made by Nihon Kayaku Co.

A is a photosensitive composition having a resin acid value of 36 mgKOH/g and capable of being developed with an aqueous alkaline solution (30° C., 1% aqueous sodium carbonate solution). Composition B is a photosensitive composition having a resin acid value of 1 mgKOH/g capable of being developed with aqueous alcohol solution (40° C., diethyleneglycol monobutylether 500 ml/l aqueous solution).

The above compositions A and B are inks containing 70% solid components (solvent:cellosolve acetate 30%).

Each of the compositions A and B shown in Table 3 was mixed by a three roll kneader, was printed on the surface of an inner layer wiring board by screen process, and dried at 70° C. for 30 minutes. Subsequently, through-hole masks having diameters in a range of 30 μm to 100 μm in diameter with 10 μm in diameter difference were tightly contacted by vacuum, and were exposed to 400 mJ/cm².

Then composition A was developed by spraying with a 1% aqueous sodium carbonate solution at 30° C. by spraying for 120 seconds. Composition B was developed with diethylene glycol monobutylether 500 ml/l aqueous solution at 40° C. Resolution was evaluated after water washing and drying.

Further, after post-exposure was performed at 1000 mJ/cm², the compositions were heated at 140° C. for 30 minutes.

Thickness of the photosensitive resin layer after heating was about 50 μm.

Subsequently, the surface of the photosensitive resin was roughened with $KMnO_4$ aqueous solution (concentration 70 g/l) with a PH of 14.0 at 70° C. for 5 minutes. After washing with water, neutralizing with aqueous hydroxylamine hydrochloride solution (concentration 30 g/l) was performed at 40° C. for 5 minutes. After washing with water, the surface was cleaned with an aqueous solution of EDTA and hydrazine hydrate, and wasted with water again. Then, after adhering Pd as a catalyst, the same plating as in embodiments 1–6 was performed using electroless copper plating solution for one hour. The temperature of the plating solution was 30° C. A plating film of about 1.0 μm thick was deposited onto the roughened surface of the photosensitive resin. After washing with water, the photosensitive resin was heated at 180° C. for 60 minutes.

Using the test pieces obtained by the above process, thermal deformation temperature of the photosensitive resin (thermal deformation temperature), peel strength of the plated wiring, heat resistance for soldering, and galvanic corrosion resistance were evaluated. The peel strength of the plated wiring was determined under two conditions such as at 25° C. and at high temperature (170° C.). The galvanic corrosion resistance was performed in order to examine the insulating resistance between the inner wiring layer and the plated wiring in a direction of the film thickness under an applied voltage of DC 100 Volt, at 85° C., under 85% RH for 1000 hours. Further, withstand voltage was determined. Furthermore, flame resistance tests by UL-94 were performed. The results of the above tests are shown in Table 4.

TABLE 4

| Evaluation | | Composition A | Composition B |
|---|---|---|---|
| Resolution (diameter;μm) | | 60 | 50 |
| Tg (°C.) | | 121 | 135 |
| Peel strength | 25° C. | 2.2 | 2.0 |
| (kgf/cm) | 170° C. | 0.6 | 0.5 |
| Heat resistance for soldering (s) | | >60 | >60 |
| Galvanic corrosion resistance (Ω) | Initial value | $10^{12}$ | $10^{12}$ |
| | 500 hours | $10^{12}$ | $10^{12}$ |
| | 1000 hours | $10^{11}$ | $10^{11}$ |
| Dielectric breakdown voltage (kV) | | 3.5 | 3.7 |
| UL-94 | Maximum burning time (s) | 3 | 2 |
| | Average burning time (s) | 4.2 | 3.3 |
| | Level | VO | VO |

The composition in the present embodiment has an improved resolution and thermal deformation temperature in comparison to embodiments 1–6. Further, the composition has a preferable galvanic corrosion resistance and dielectric breakdown voltage, and a satisfactory level of VO in the flame resistance test by UL-94. Accordingly, a connecting-hole can be formed within a wiring of 100 μm wide, for instance, without forming a land, and consequently, wiring density can be increased. Therefore, a reliable connecting-hole printed wiring board having preferable heat resistance, insulating property, and flame resistance can be obtained.

Since the photosensitive resin composition according to the present invention has excellent adhesion with the plating metal, resolution, photo-curing, thermosetting, thermal resistance, and is capable of being developed using an alkaline solution or an aqueous solution containing a non-halogen based organic solvent as the developing solution, it is possible to provide a high density and highly reliable print board of the layered type. It is also possible to provide a method of fabrication that is environmentally conscious and safe.

Since the resin has good adhesion on the plating metal, resolution, photo-curing, thermosetting and thermal resistance, it is possible to use it as an adhesive additive.

Although the invention has been described and illustrated in detail, it is to be clearly understood that the same is by way of illustration and example, and is not to be taken by way of limitation. The spirit and scope of the present invention are to be limited only by the terms of the appended claims.

What is claimed is:

1. A photosensitive resin composition, comprising:
    (a) a first reaction product that is a reaction product of (A) a member of the group consisting of a bisdhenol A epoxy resin, a phenol novolak epoxy resin, and a cresol novolak epoxy resin, and an epoxy resin halide thereof with (B) an unsaturated carboxylic acid;

(b) a thermosettable epoxy resin;

(c) a second reaction product that is a reaction product of an epoxy resin and a carboxy terminated acrylonitrile-butadiene rubber;

(d) a photo-polymerization initiator; and (e) a thermosetting agent, wherein:

the first reaction product has been further reacted with a saturated or unsaturated polybasic acid anhydride.

2. A photosensitive resin composition, comprising:

a first reaction product that is a reaction product of (A) a member of the group consisting of a bisphenol A epoxy resin, a phenol novolak epoxy resin, and a cresol novolak epoxy resin, and an epoxy resin halide thereof with (B) an unsaturated carboxylic acid in an acid equivalent/epoxy equivalent ratio within the range of 0.1 to 1.0, wherein hydroxyl groups of said reaction product are reacted with a saturated or unsaturated polybasic acid anhydride in an acid equivalent/hydroxyl equivalent ratio within the range of 0.1 to 1.0;

(b) a thermosettable epoxy resin;

(c) a second reaction product that is a reaction product of an epoxy resin and a carboxy terminated acrylonitrile-butadiene rubber;

(d) a photo-polymerization initiator; and (e) a thermosetting agent.

3. A photosensitive resin composition, comprising:

(a) 10 to 80 parts by weight of a first reaction product that is a reaction product of (A) a member of the group consisting of a bisphenol A epoxy resin, a phenol novolak epoxy resin, and a cresol novolak epoxy resin, and an epoxy resin halide thereof with (B) an unsaturated carboxylic acid;

(b) 10 to 80 parts by weight of a thermosettable epoxy resin;

(c) 10 to 80 parts by weight of a second reaction product that is a reaction product of an epoxy resin and a carboxy terminated acrylonitrile-butadiene rubber;

(d) 0.1 to 10 parts by weight of a photo-polymerization initiator; and (e) 0.1 to 20 parts by weight of a thermosetting agent, wherein the total weight of the photosensitive resin composition comprises 100 parts by weight.

4. A photosensitive resin composition according to claim 3, wherein:

said photosensitive resin composition is developable by an aqueous solution containing diethylene glycol monobutyl ether and sodium borate.

5. A photosensitive resin composition, comprising:

(a) 10 to 50 parts by weight of a first reaction product that is a reaction product of (A) a member of the group consisting of a bisphenol A epoxy resin, a phenol novolak epoxy resin, and a cresol novolak epoxy resin, and an epoxy resin halide thereof with (B) an unsaturated carboxylic acid;

(b) 10 to 50 parts by weight of a thermosettable epoxy resin;

(c) 10 to 50 parts by weight of a second reaction product that is a reaction product of an epoxy resin and a carboxy terminated acrylonitrile-butadiene rubber;

(d) 0.1 to 10 parts by weight of a photo-polymerization initiator; and (e) 0.1 to 20 parts by weight of a thermosetting agent, wherein hydroxyl groups of said first reaction product have been reacted with an unsaturated polybasic acid anhydride; and wherein the total weight of the photosensitive resin composition comprises 100 parts by weight.

6. A photosensitive resin composition according to claim 5, wherein:

said photosensitive resin composition is developable by an aqueous solution containing at least one compound selected from the group consisting of sodium hydroxide, potassium hydroxide, and sodium carbonate.

\* \* \* \* \*